US009001095B2

(12) United States Patent
Park et al.

(10) Patent No.: US 9,001,095 B2
(45) Date of Patent: Apr. 7, 2015

(54) ILLUMINATION SENSING DEVICE HAVING A REFERENCE VOLTAGE SETTING APPARATUS AND A DISPLAY DEVICE INCLUDING THE ILLUMINATION SENSING DEVICE

(75) Inventors: Sung-Un Park, Yongin (KR); Soon-Sung Ahn, Yongin (KR); Do-Youb Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1028 days.

(21) Appl. No.: 12/915,487

(22) Filed: Oct. 29, 2010

(65) Prior Publication Data

US 2011/0102391 A1 May 5, 2011

(30) Foreign Application Priority Data

Nov. 5, 2009 (KR) ........................ 10-2009-0106650

(51) Int. Cl.

*G06F 3/038* (2013.01)
*G09G 5/00* (2006.01)
*H03K 3/356* (2006.01)
*G09G 3/20* (2006.01)

(52) U.S. Cl.

CPC ............ *G09G 3/20* (2013.01); *G09G 2360/144* (2013.01)

(58) Field of Classification Search

CPC ..... G09G 3/20; G09G 2360/144; G02F 1/133
USPC .................................................. 345/207, 561
See application file for complete search history.

(56) References Cited

U.S. PATENT DOCUMENTS

| | | | | |
|---|---|---|---|---|
| 7,462,813 | B2 | 12/2008 | Hirose et al. | |
| 7,898,619 | B2 * | 3/2011 | Katoh et al. | 349/116 |
| 2007/0023614 | A1 * | 2/2007 | Park et al. | 250/214.1 |
| 2008/0094347 | A1 | 4/2008 | Lee et al. | |
| 2009/0066876 | A1 | 3/2009 | Woo et al. | |
| 2010/0097354 | A1 * | 4/2010 | Ahn et al. | 345/175 |
| 2011/0102464 | A1 * | 5/2011 | Godavari | 345/650 |

FOREIGN PATENT DOCUMENTS

| | | |
|---|---|---|
| JP | 06-215404 | 8/1994 |
| JP | 2000-329615 | 11/2000 |

(Continued)

OTHER PUBLICATIONS

Korean Registration Determination Certificate dated Mar. 29, 2012 issued by the KPO for corresponding Korean Patent Application No. 10-2009-0106650, 5 pages.

(Continued)

*Primary Examiner* — Kumar Patel
*Assistant Examiner* — Sejoon Ahn
(74) *Attorney, Agent, or Firm* — Christie, Parker & Hale, LLP

(57) ABSTRACT

A reference voltage setting apparatus including: a current generator having a first device to supply a first dark current and a second device to supply a second dark current; a first operational amplifying unit connected to the current generator; and a voltage setting unit connected to the first operational amplifying unit and setting a reference voltage having a compensated offset voltage of the first operational amplifying unit, and an illumination sensing device and a display device including the reference voltage setting apparatus.

13 Claims, 7 Drawing Sheets

(56) References Cited

FOREIGN PATENT DOCUMENTS

| | | | |
|---|---|---|---|
| JP | 2006-118965 | | 5/2006 |
| JP | 2007-052842 | | 3/2007 |
| KR | 10-2007-0115614 | | 12/2007 |
| KR | 10-2008-0035954 | | 4/2008 |
| KR | 10-2009-0025935 | | 3/2009 |
| WO | WO 2008/130060 | A1 | 10/2008 |
| WO | WO 2008130060 | A1 * | 10/2008 ............ H01L 31/153 |

OTHER PUBLICATIONS

Extended Search Report for corresponding European Patent Application No. 10188942.6, dated Feb. 18, 2011.

JPO Office action dated Apr. 1, 2014, for corresponding Japanese Patent application 2010-219610, (6 pages).

* cited by examiner

ILLUMINATION SENSING DEVICE HAVING A REFERENCE VOLTAGE SETTING APPARATUS AND A DISPLAY DEVICE INCLUDING THE ILLUMINATION SENSING DEVICE

CROSS-REFERENCE TO RELATED APPLICATION

This application claims the benefit of Korean Patent Application No. 10-2009-0106650, filed on Nov. 5, 2009, in the Korean Intellectual Property Office, the disclosure of which is incorporated herein by reference.

BACKGROUND

1. Field of the Invention

An aspect of the embodiment of the present invention relates to an illumination sensing device including a reference voltage setting apparatus, and a display device including the illumination sensing device.

2. Description of the Related Art

Display devices such as plasma display panels (PDPs), liquid crystal displays (LCDs), and organic light emitting diode (OLED) display devices are widely used as TVs, computer monitors, displays of cellular phones, etc.

However, the visibility of a screen of a display device may decrease according to ambient brightness. For example, a user feels that a screen is too bright in low ambient light. On the other hand, the user feels that the screen with the same brightness is too dark in high ambient light.

In order to overcome this problem, an auto brightness control technique has been used in display devices. Auto brightness control is performed by sensing ambient brightness of a display device, and controlling brightness of data displayed on the screen of the display device according to the ambient brightness. Thus, ambient brightness needs to be accurately measured in the auto brightness control technique.

SUMMARY OF THE INVENTION

An aspect of the present invention provides a reference voltage setting apparatus, and an illumination sensing device and a display device including the reference voltage setting apparatus in which a dark current and an offset voltage of an operational amplifier are compensated.

According to an aspect of the present invention, there is provided a reference voltage setting apparatus including: a current generator including a first device for supplying a first dark current and a second device for supplying a second dark current; a first operational amplifying unit connected to the current generator; and a voltage setting unit connected to the first operational amplifying unit and setting a reference voltage having a compensated offset voltage of the first operational amplifying unit.

According to another aspect of the present invention, in the current generator, the first device may be connected between a first power supply and a reference node and supply the first dark current according to ambient temperature; and the second device may be connected between the reference node and a second power supply and supply a second dark current according to ambient temperature.

According to another aspect of the present invention, the first device may be a dark diode, and the second device may be a photodiode including a light shielding film.

According to another aspect of the present invention, the first operational amplifying unit may include: an input terminal; a second input terminal connected to the reference node through a first switch or applying a control voltage through a second switch; and an output terminal connected to the voltage setting unit.

According to another aspect of the present invention, the first operational amplifying unit may include a third switch connecting the first input terminal and the output terminal.

According to another aspect of the present invention, there is provided an illumination sensing device including: a dark diode; a photodiode electrically connected to the dark diode; a first operational amplifying unit connected to the dark diode and the photodiode; and an illumination calculator connected to the first operational amplifying unit; and a voltage setting unit connected to the first operational amplifying unit and setting a reference voltage applied to the first operational amplifying unit.

According to another aspect of the present invention, the first operational amplifying unit may include: an inverting input terminal connected to a cathode terminal of the photodiode; a non-inverting input terminal to which a reference voltage set by a reference voltage setting unit is input; and an output terminal connected to the illumination calculator.

According to another aspect of the present invention, the illumination sensing device may further include a capacitor connected between the inverting input terminal and the output terminal of the first operational amplifying unit.

According to another aspect of the present invention, the first operational amplifying unit may include a first switch connecting the first inverting input terminal and the output terminal.

According to another aspect of the present invention, the reference voltage setting unit may include: a current generator including a first device for supplying a first dark current and a second device for supplying a second dark current; a second operational amplifying unit connected to the current generator; and a voltage setting unit connected to the second operational amplifying unit and setting a reference voltage having a compensated offset voltage of the second operational amplifying unit.

According to another aspect of the present invention, in the current generator, the first device may be connected between a first power supply and a reference node and supply the first dark current according to ambient temperature; and the second device may be connected between the reference node and a second power supply and supply the second dark current according to ambient temperature.

According to another aspect of the present invention, the first device may be a dark diode, and the second device may be a photodiode including a light shielding film.

According to another aspect of the present invention, the second operational amplifying unit may include: an input terminal; a second input terminal connected to the reference node through a second switch or applying a control voltage through a third switch; and an output terminal connected to the voltage setting unit.

According to another aspect of the present invention, the second operational amplifying unit may include a fourth switch connecting the first input terminal and the output terminal.

According to another aspect of the present invention, the voltage setting unit may compare a voltage of a reference node output through the second operational amplifying unit with a control voltage output by the second operational amplifying unit and set a voltage equalizing the two voltages as a reference voltage of the first operational amplifying unit.

According to another aspect of the present invention, there is provided a display device including: a pixel unit including a plurality of pixels; an illumination sensing device sensing illumination of external incident light; a plurality of drive units operating the pixel unit; and a controller to control the drive units and brightness of data displayed in the pixel unit according to the illumination of light sensed by the illumination sensing device, wherein the illumination sensing device includes: a dark diode; a photodiode electrically connected to the dark diode; a first operational amplifying unit connected to the dark diode and the photodiode; an illumination calculator connected to the first operational amplifying unit; and a reference voltage setting unit connected to the first operational amplifying unit and setting a reference voltage applied to the first operational amplifying unit.

According to another aspect of the present invention, the reference voltage setting unit may include: a current generator including a first device to supply a first dark current and a second device to supply a second dark current; a second operational amplifying unit connected to the current generator; and a voltage setting unit connected to the second operational amplifying unit, setting a reference voltage having a compensated offset voltage of the second operational amplifying unit, and applying the reference voltage to the first operational amplifying unit.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
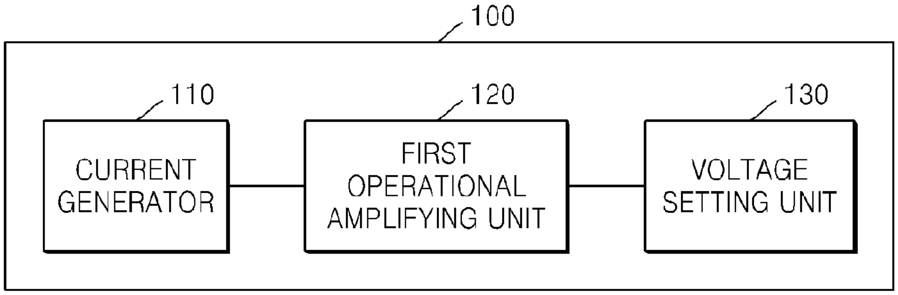
FIG. 1 is a block diagram of a reference voltage setting unit according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A conventional illumination sensing device measuring brightness of ambient light includes a photodiode and an operational amplifier.

In the conventional illumination sensing device, the photodiode generates not only a photocurrent according to ambient brightness but also a dark current according to ambient temperature. Thus, the ambient brightness may not be accurately measured due to the influence of the dark current.

In addition, an output voltage of the operational amplifier of the conventional illumination sensing device includes an offset voltage. An ideal operational amplifier has an offset voltage of zero (0) volts since the voltage difference between an inverting input terminal and a non-inverting input terminal is always zero (0) volts. However, a real operational amplifier has an offset voltage since the voltage difference between the inverting input terminal and the non-inverting input terminal is not zero (0) volts. Since the offset voltage affects the measurement of illumination, an output voltage apart from the offset voltage is required to be obtained in order to accurately measure illumination.

FIG. 1 is a block diagram of a reference voltage setting unit 100 according to an embodiment of the present invention. Referring to FIG. 1, the reference voltage setting unit 100 according to the present embodiment includes a current generator 110, a first operational amplifying unit 120, and a voltage setting unit 130.

The current generator 110 is not influenced by external incident light, but generates current according to ambient temperature. The current generator 110 includes a first device (not shown) for supplying a first dark current and a second device (not shown) for supplying a second dark current. The first device may be a dark diode, and the second device may be a photodiode including a light shielding film.

The first operational amplifying unit 120 includes an operational amplifier (not shown) and a switch (not shown), and performs, with the voltage setting unit 130, an operation for setting a reference voltage compensating for an offset voltage using a voltage applied by the current generator 110 and a control voltage.

The voltage setting unit 130 performs an operation for setting a reference voltage with the first operational amplifying unit 120, and applies the set reference voltage to an illumination sensing device (not shown).

A reference voltage having a compensated error of a dark current generated when the dark diode and the photodiode are simultaneously used, and a compensated offset voltage of an operational amplifier may be obtained by the reference voltage setting unit 100 according to the present embodiment. The obtained reference voltage is applied to the illumination sensing device (not shown) or an illumination sensing unit (not shown), so that illumination may be accurately sensed.

Figure 2:
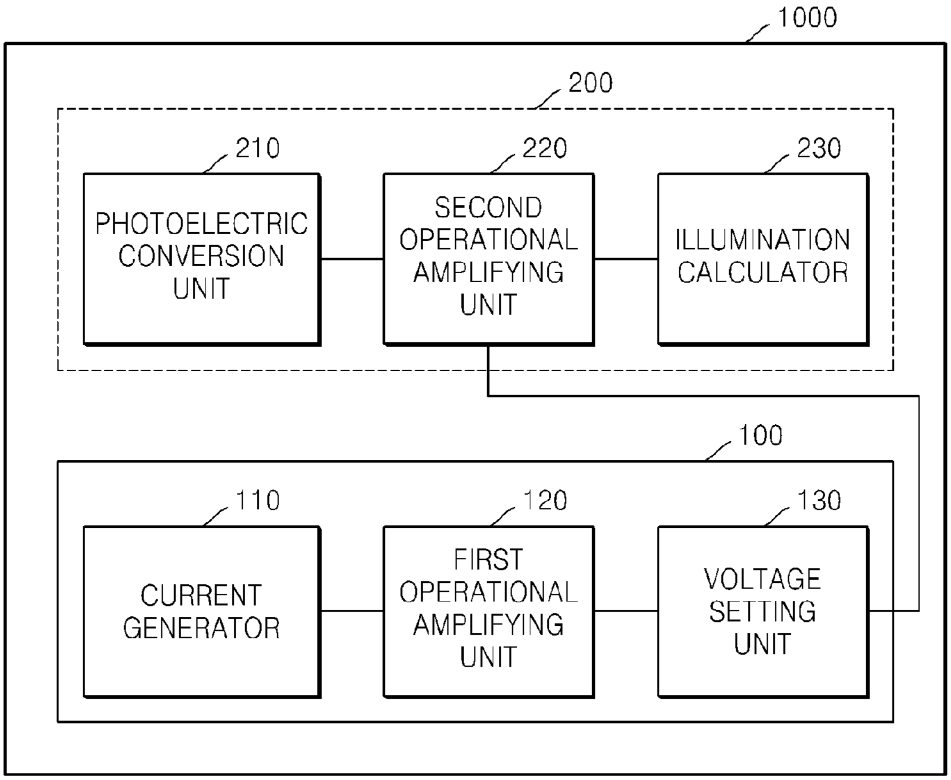
FIG. 2 is a block diagram of an illumination sensing device including the reference voltage setting unit according to an embodiment of the present invention.

FIG. 2 is a block diagram of an illumination sensing device 1000 including a reference voltage setting unit 100 according to an embodiment of the present invention. Referring to FIG. 2, the illumination sensing device 1000 includes an illumination sensing unit 200 and the reference voltage setting unit 100. The illumination sensing unit 200 includes a photoelectric conversion unit 210, a second operational amplifying unit 220, and an illumination calculator 230.

The components and functions of the reference voltage setting unit 100 are the same as or similar to those of the reference voltage setting unit 100 described with reference to FIG. 1, and thus descriptions thereof will be omitted herein.

The photoelectric conversion unit 210 includes a dark diode (not shown) for generating a dark current according to ambient temperature and a photodiode (not shown) for generating a photocurrent and a dark current according to ambient brightness and temperature.

The second operational amplifying unit 220 is connected to the photoelectric conversion unit 210, and outputs an output voltage after a time integral of the photocurrent applied by the photoelectric conversion unit 210. In this regard, the output voltage is determined by the reference voltage set and applied by the reference voltage setting unit 100. Specifically, the output voltage is a difference between the reference voltage and a voltage after a time integral of the photocurrent.

The reference voltage set by the reference voltage setting unit 100 is applied to the second operational amplifying unit 220. In this regard, the reference voltage has a compensated offset voltage of the operational amplifier, and thus errors caused by the offset voltage may be removed while illumination is sensed.

In addition, the reference voltage is obtained by the reference voltage setting unit 100 using a reverse bias voltage of a dark diode in order to offset the dark current, and thus errors caused by the dark current may be removed.

The illumination calculator 230 calculates ambient illumination using the output voltage output by the second operational amplifying unit 220. The illumination calculator 230 may include an analog-to-digital converter (ADC) (not shown) for converting the output voltage into a digital value. The illumination calculator 230 may be operated in various ways. For example, illumination values corresponding to the output voltage are shown as a table, so that illumination according to the output voltage may be identified. Or, the time taken for the output voltage to increase or decrease to predetermined values is measured, and the measured time may be converted into brightness information using the table. However, the method of calculating ambient brightness is not limited thereto.

Figure 3:
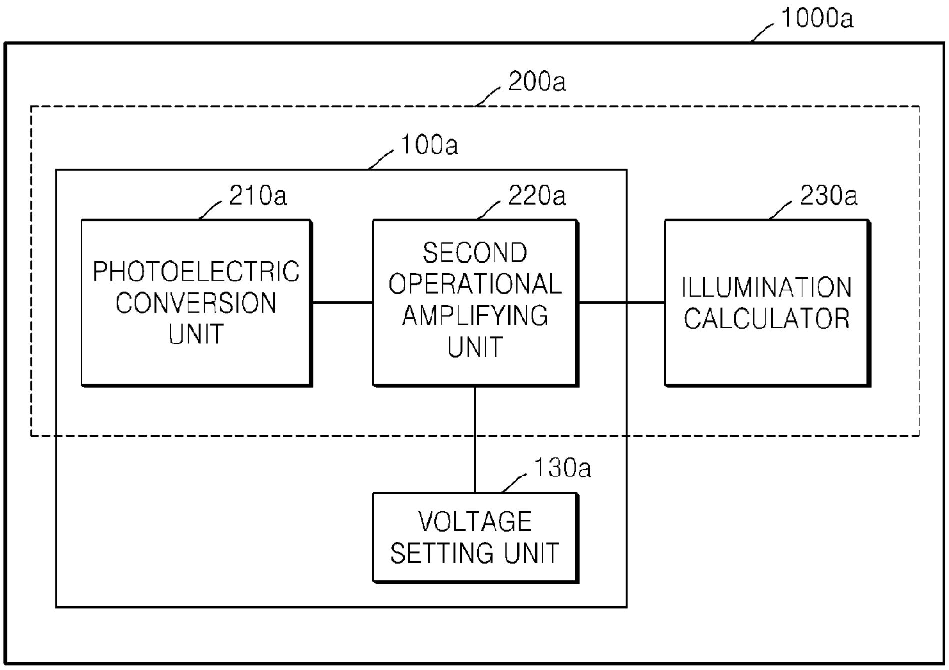
FIG. 3 is a block diagram of an illumination sensing device including the reference voltage setting unit of FIG. 2 according to another embodiment of the present invention.

FIG. 3 is a block diagram of an illumination sensing device 1000*a* including the reference voltage setting unit 100 of FIG. 2, according to another embodiment of the present invention. In the illumination sensing device 1000*a* shown in FIG. 3, a part of a reference voltage setting unit 100*a* and a part of a illumination sensing unit 200*a* are used in common, when compared to the illumination sensing device 1000 of FIG. 2. The rest of the components and the functions of the illumination sensing device 1000*a* are the same as or similar to those of the illumination sensing device 1000, and thus descriptions thereof will be omitted herein.

Referring to FIG. 3, a photoelectric conversion unit 210*a* and a second operational amplifying unit 220*a* of the illumination sensing unit 200*a* may be used in common as components of the reference voltage setting unit 100*a*, as will be described in more detail with reference to FIG. 6.

The illumination sensing device 1000*a* of FIG. 3 operates in two different modes. In a first mode, the photoelectric conversion unit 210*a*, the second operational amplifying unit 220*a*, and the voltage setting unit 130*a* are activated to set a reference voltage. In a second mode, illumination is measured using the reference voltage. Here, the photoelectric conversion unit 210*a*, the second operational amplifying unit 220*a*, and the illumination calculator 230*a* are activated. That is, in a second mode, the photoelectric conversion unit 210*a*, the second operational amplifying unit 220*a*, and the illumination calculator 230*a* are activated, and illumination is measured using the reference voltage.

The combination of the reference voltage setting units 100 and 100*a* and the illumination sensing units 200 and 200*a* is not limited to FIG. 3, and may be modified in various ways. The constitution and operation thereof are the same or similar, and thus will be omitted herein.

Figure 4:
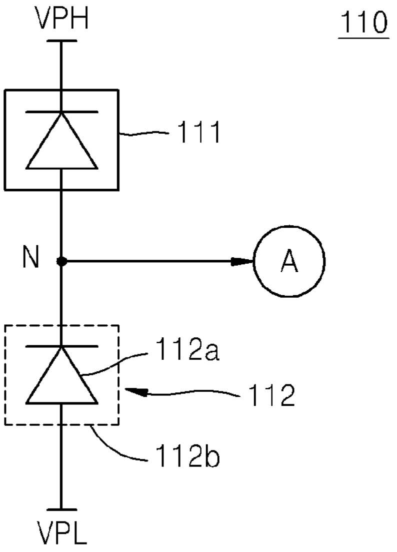
FIG. 4 is a circuit diagram of the current generator of the reference voltage setting apparatus of FIG. 1.
Figure 5A:
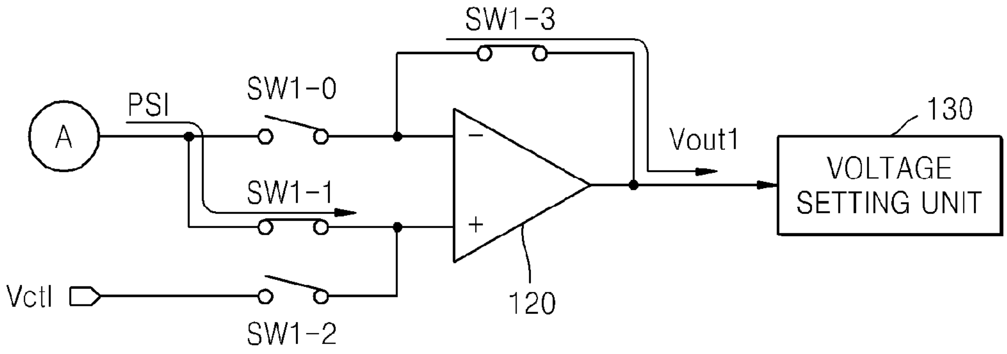
FIGS. 5A and 5B are circuit diagrams of the first operational amplifying unit and the voltage setting unit of the reference voltage setting unit of FIG. 1.
Figure 5B:
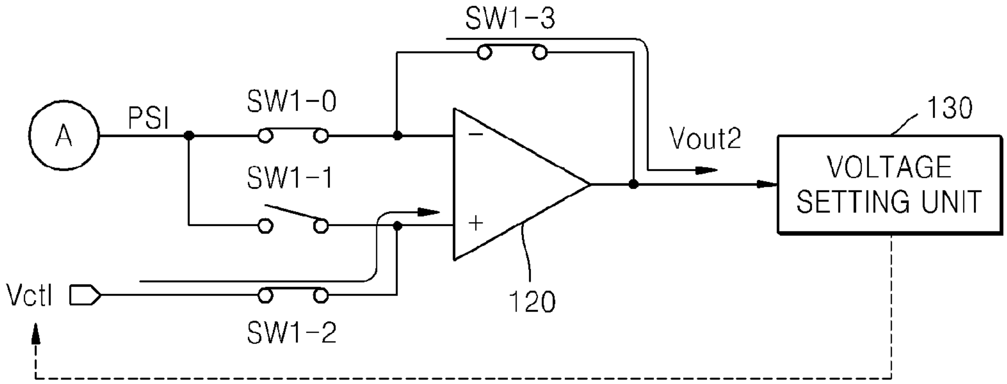

FIGS. 4, 5A, and 5B are circuit diagrams of components of the reference voltage setting unit 100 of FIG. 1.

FIG. 4 is a circuit diagram of the current generator 110 of the reference voltage setting unit 100 of FIG. 1. Referring to FIG. 4, the current generator 110 includes a first device 111 and a second device 112. The current generator 110 includes the first device 111 that is connected between a first power supply VPH and a reference node N and generates a first dark current according to ambient temperature, and the second device 112 that is connected between the reference node N and a second power supply VPL and generates a second dark current according to ambient temperature. The positions of the first device 111 and the second device 112 may be changed.

In this regard, the first device 111 may be a dark diode for generating a dark current according to ambient temperature. The second device 112 includes a photodiode 112*a* for generating a photocurrent and a dark current according to ambient light and temperature and a light shielding film 112*b* for preventing the photodiode 112*a* from generating a photocurrent by ambient light. Thus, the second device 112 generates only a dark current due to the ambient temperature.

A first terminal of the first device 111 is connected to the first power supply VPH, and a second terminal of the first device 111 is connected to the reference node N. In this regard, the first terminal may be a cathode electrode, and the second terminal may be an anode electrode. In addition, a first terminal of the second device 112 is connected to the reference node N, and a second terminal of the second device 112 is connected to the second power supply VPL. The first power supply VPH is greater than the second power supply VPL. Thus, a reverse bias voltage is applied to the first device 111 and the second device 112 including the light shielding film 112*b*. In this regard, the second power supply VPL may be a ground voltage GND.

The first device 111 and the second device 112 including the light shielding film 112*b* of the current generator 110 may be the same as the dark diode and the photodiode of the photoelectric conversion unit 210 of the illumination sensing device 1000 of FIG. 2 so that the reference voltage having a compensated dark current for the illumination sensing device 1000 may be set.

The reference voltage that is input to the illumination sensing unit 200 via the current generator 110 is set according to the following reasons. In order to measure illumination by ambient light, ambient temperature as a factor influencing the illumination should be removed. For this, the illumination sensing device 1000 of FIG. 2 uses a dark diode and a photodiode at the same time. In this regard, a dark current generated by ambient temperature in the photodiode is offset by a dark current generated in the dark diode, so that only a photocurrent generated by ambient light in the photodiode is considered. In order to obtain this result, the dark current generated in the photodiode should be the same as the dark current generated in the dark diode. If the dark currents are the same, only the influence by the photocurrent may be considered without considering the influence of the dark current.

However, the dark currents generated in a dark diode and a photodiode may not be completely same even though the size of the dark diode is the same as that of the photodiode. Ideally, if a dark diode and a photodiode having the same size have the same characteristics, the same dark current should be generated when a reverse bias voltage with the same size as the dark current is applied thereto. However, the dark current may vary due to processing conditions and ambient temperature. The dark current generated in the dark diode is also influenced by a reverse bias voltage applied to the dark diode in addition to the ambient temperature. For example, as the reverse bias voltage increases, the dark current flowing in the dark diode increases exponentially.

Accordingly, the difference of dark currents between the dark diode and the photodiode may be compensated for by applying a reverse bias voltage having an appropriate size to the dark diode used in an illumination sensing device. That is, if the dark current of the dark diode used in the illumination sensing device is greater than the dark current of the photodiode, a small reverse bias voltage is applied to the dark diode, so that the dark current generated in the dark diode may be the same as the dark current generated in the photodiode.

In other words, if a reverse bias voltage that may offset the dark current is determined and applied to the illumination sensing device as a reference voltage, a node voltage between the dark diode and the photodiode used in the illumination sensing device may be set as the reference voltage. Thus, the reference voltage set by the reference voltage setting apparatus may be used in the illumination sensing device, so that illumination by ambient light may be accurately measured.

As described above, since the dark current generated in the photodiode is important in the reference voltage setting unit 100, a light shielding film is used to generate only dark current in the photodiode.

FIGS. 5A and 5B are circuit diagrams of the first operational amplifying unit 120 and the voltage setting unit 130 of the reference voltage setting unit 100, according to an embodiment of the present invention.

The first operational amplifying unit 120 may be the same as the second operational amplifying unit 220 so that the reference voltage having a compensated offset voltage of the operational amplifier may be applied to the reference voltage setting unit 100 of FIG. 2.

Referring to FIG. 5A, the first operational amplifying unit 120 of the reference voltage setting unit 100 includes an inverting input terminal, a non-inverting input terminal, and an output terminal. The inverting input terminal may be connected to the reference node N of the current generator 110 via a SW1-0 switch. The non-inverting input terminal may be connected to the reference node N via a SW1-1 switch or connected to a control voltage Vctl via a SW1-2 switch. The output terminal is connected to the voltage setting unit 130. In addition, the inverting input terminal is connected to the output terminal via a SW1-3 switch. Although not shown herein, a capacitor may be disposed between the inverting input terminal and the output terminal if the operational amplifier is shared with the illumination sensing unit 200 as shown in FIG. 3.

Referring to FIGS. 5A and 5B, the operations of the current generator 110, the first operational amplifying unit 120, and the voltage setting unit 130 of the reference voltage setting unit 100 will be described.

A first dark current is generated in the first device 111 (the dark diode) according to the ambient temperature, and a second dark current is generated in the second device 112 (the photodiode 112*a* and the light shielding film 112*b*). In this regard, even though the first and second dark currents are different from each other, the current generator 110 determines an electric potential PSI of the reference voltage node N such that the same dark currents flow in the first and second devices 111 and 112.

Referring to FIG. 5A, the switches SW1-0 and SW1-2 are off, and the switches SW1-1 and SW1-3 are on, in the first mode.

In this regard, the electric potential PSI of the reference node N is applied to the non-inverting input terminal of the first operational amplifying unit 120. Since the first operational amplifying unit 120 functions as a voltage follower, a voltage corresponding to the electric potential PSI of the reference node N is output to the output terminal. However, since the first operational amplifying unit 120 includes an offset voltage, the output voltage Vout1 is a sum of the electric potential PSI of the reference node N and the offset voltage of the first operational amplifying unit 120. In this regard, PSI indicates a voltage of the reference node N, and Voffset indicates an offset voltage of the first operational amplifying unit 120. If Vin− is an input voltage of the inverting input terminal, and Vin+ is an input voltage of the non-inverting input terminal, the Voffset may satisfy the equation Voffset=Vin−−Vin+.

$$Vout1=PSI+Voffset \quad \text{Equation 1}$$

The voltage setting unit 130 connected to the output terminal of the first operational amplifying unit 120 stores an output voltage Vout1 according to Equation 1.

Referring to FIG. 5B, the switch SW1-1 of the first operational amplifying unit 120 is off, and the switches SW1-0, SW1-2, and SW1-3 are on, in the second mode.

Here, the control voltage Vctl is applied to the non-inverting input terminal of the first operational amplifying unit 120. Since the first operational amplifying unit 120 functions as a voltage follower, a sum of a control voltage and an offset voltage is output voltage Vout2 as Equation 2 below.

$$Vout2=Vctl+Voffset \quad \text{Equation 2}$$

The voltage setting unit 130 connected to the output terminal of the first operational amplifying unit 120 compares the output voltage Vout1 of Equation 1 with the output voltage Vout2 of Equation 2.

The voltage setting unit 130 identifies whether both of the output voltages are the same or have a difference within a predetermined error range. As a result, if both of the output voltages are the same or have a difference within a predetermined error range, the control voltage Vctl is determined as the reference voltage Vref that will be applied to the second operational amplifying unit 220 of the illumination sensing device 1000 of FIG. 2. However, if both of the output voltages are not the same and have a difference that is not within the predetermined error range, the control voltage Vctl is controlled.

An initial control voltage Vctl may arbitrarily be determined. An algorithm or a trial error by which a target value is detected may be used when the control voltage Vctl is controlled for setting the reference voltage. For example, an intermediate value between the first power supply VPH and the second power supply VPL is input as an initial control voltage Vctl and compared with a target value. If an output is required to be increased, another intermediate value between the intermediate value and the first power supply VPH is input and compared with the target value. This process may be repeated. Alternatively, an intermediate value between the first power supply VPH and the second power supply VPL is input as an initial control voltage Vctl and compared with the target value, and then continuously compared with the target value while increasing the intermediate value by value of an initial voltage range of the control voltage Vctl. That is, a variety of algorithms may be used to search for the initial control voltage Vctl.

The reference voltage setting unit 100 according to an embodiment of the present invention may determine the reference voltage by compensating for the offset voltage of the operational amplifier using the voltage setting unit 130 and compensating for the dark current using the current generator 110. Using the reference voltage obtained as described above, illumination in which the influence of the dark current and the offset voltage are removed may be accurately measured.

Figure 6:
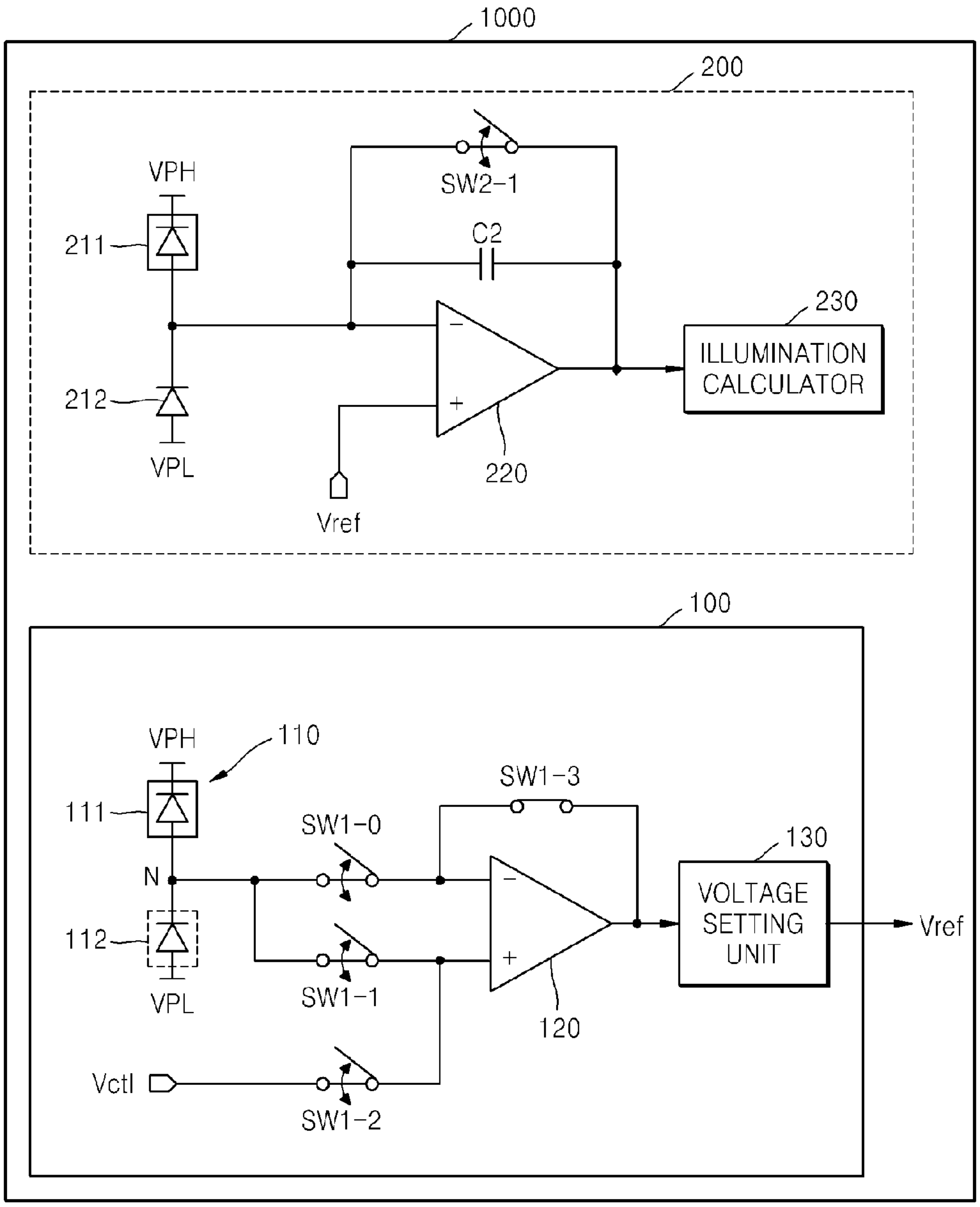
FIG. 6 is a block diagram of the illumination sensing device including the reference voltage setting unit of FIG. 2.

FIG. 6 is a circuit diagram of the illumination sensing device 1000 of FIG. 2.

Referring to FIGS. 2 and 6, the illumination sensing device 1000 includes the illumination sensing unit 200 and the reference voltage setting unit 100. The illumination sensing unit 200 includes the photoelectric conversion unit 210 including a dark diode 211 and a photodiode 212, the second operational amplifying unit 220, a switch SW2-1, a capacitor C2, and the illumination calculator 230.

The reference voltage setting apparatus 100 includes a current generator 110, a first operational amplifying unit 120, and a voltage setting unit 130. The components and functions of the reference voltage setting unit 100 are the same as or similar to those of the reference voltage setting unit 100 described with reference to FIGS. 4, 5A, and 5B, and thus descriptions thereof will be omitted herein.

In addition, the operations of the reference voltage setting unit 100 are the same as those described with reference to FIGS. 4, 5A, and 5B, and thus descriptions thereof will be omitted herein.

Hereinafter, the illumination sensing unit 200 will be described in more detail.

The dark diode 211 generates a current according to ambient temperature. A cathode electrode of the dark diode 211 is connected to the first power supply VPH, and an anode electrode of the dark diode 111 is connected to an inverting input terminal of the second operational amplifying unit 220. The electric potential of the first power supply VPH is greater than that of the reference voltage Vref, and thus a reverse bias voltage is applied to the dark diode 211.

The photodiode 212 generates a current according to ambient brightness and ambient temperature. A cathode electrode of the photodiode 212 is connected to the inverting input terminal of the second operational amplifying unit 220, and an anode electrode of the photodiode 212 is connected to the second power supply VPL. The reference voltage Vref is greater than the electric potential of the second power supply VPL. Thus, a reverse bias voltage is applied to the photodiode 212.

The second operational amplifying unit 220 includes the inverting input terminal, a non-inverting input terminal, and an output terminal, and power supplies are omitted. The inverting input terminal of the second operational amplifying unit 220 is connected to the cathode electrode of the photodiode 212, the capacitor C2, and one terminal of the Switch SW2-1. The non-inverting input terminal of the second operational amplifying unit 220 is connected to the reference voltage Vref applied by the reference voltage setting unit 100. The output terminal is connected to the illumination calculator 230.

The capacitor C2 is connected between the inverting input terminal and the output terminal of the second operational amplifying unit 220.

The Switch SW2-1 is connected between the inverting input terminal and the output terminal of the second operational amplifying unit 220.

Operations of the illumination sensing unit 200 shown in FIG. 6 will be described.

If the Switch SW2-1 is on, the inverting input terminal is connected to the output terminal of the second operational amplifying unit 220. Thus, the electric potential between the inverting input terminal and the output terminal is the same as that of the reference voltage Vref applied to the non-inverting input terminal. Here, the capacitor C2 is discharged. The reference voltage Vref is a voltage set by the reference voltage setting unit 100.

Operations of the illumination sensing unit 200 shown in FIG. 6 when the Switch SW2-1 is off will be described.

If light is incident on the photodiode 212, the photodiode 212 generates a first current according to brightness of the incident light and ambient temperature. The first current flows from the cathode electrode of the photodiode 212 to the anode electrode of the photodiode 212.

Simultaneously, the dark diode 211 generates a second current according to ambient temperature. The second current flows from the cathode electrode of the dark diode 211 to the anode electrode of the dark diode 211. Since the first current is generated by the incident light and ambient temperature, the first current is greater than the second current. That is, the first current generated in the photodiode 212 is the sum of the dark current and photocurrent, and the second current generated in the dark diode 211 only contains the dark current. Thus, a current obtained by subtracting the second current from the first current is considered.

In this regard, the photocurrent generated by the photodiode 212 is charged in the capacitor C2, and the output voltage is reduced by the operation of an integrator.

Thus, ambient brightness may be measured by measuring the output voltage after a time integral. In this regard, the output voltage is less than the reference voltage Vref. The circuits setting the reference voltage Vref and operations related to the setting are described with reference to FIGS. 4, 5A, and 5B, and thus their description will be omitted The relationship among the output voltage, time, and the photocurrent satisfies Equation 3 below. In this regard, the Vout is a voltage of the output terminal of the second operational amplifying unit 220, the Vref is a reference voltage set by the reference voltage setting unit 100 and applied to the non-inverting input terminal of the second operational amplifying unit 220, i is a photocurrent generated by the photodiode and the dark diode, C is a capacitance of the capacitor C2, and t is time from when the switch is off to when the final voltage is measured.

Equation 3

$$\begin{aligned} Vout &= Vref - \left(\frac{1}{C}\int i\,dt\right) \\ &= Vref - \left(\frac{t}{C}i\right) \end{aligned}$$

The output voltage is applied to the illumination calculator 230 to measure illumination according to the algorithm.

Accordingly, in the illumination sensing device 1000 according to an embodiment of the present invention, the dark current generated by the photodiode according to ambient temperature is offset by the dark diode, so that illumination may be accurately measured.

In the illumination sensing device 1000 according to an embodiment of the present invention, the error of the dark current may be compensated for by the reference voltage set by the reference voltage setting unit 100, and the offset voltage of the operational amplifier is compensated, and thus illumination may be accurately measured.

Figure 7:
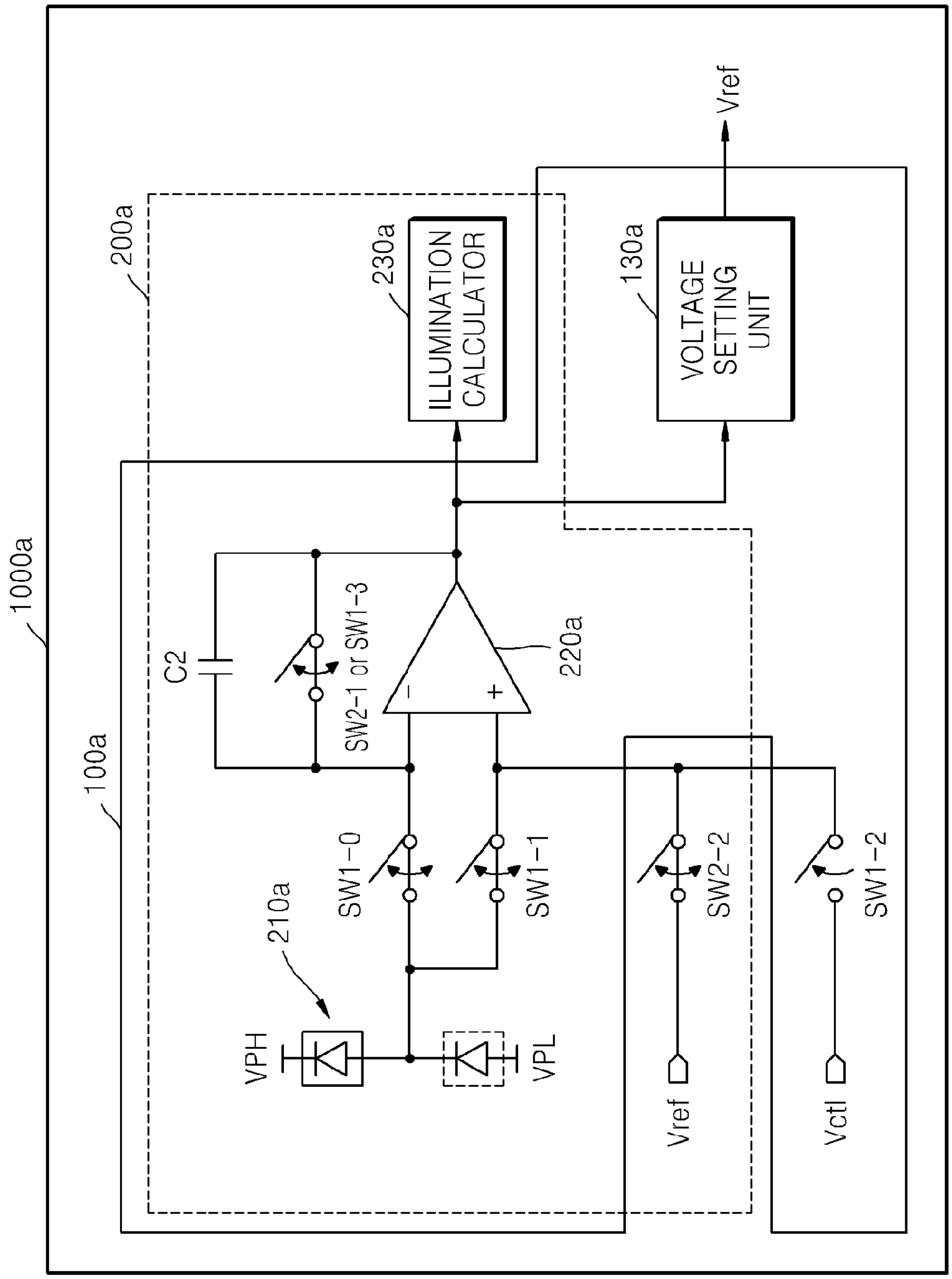
FIG. 7 is a circuit diagram of the illumination sensing device of FIG. 3.

FIG. 7 is a circuit diagram of the illumination sensing device 1000*a* of FIG. 3. In the light sensing device 1000*a* shown in FIG. 7, a part of the reference voltage setting unit 100*a* and a part of the light sensing unit 200*a* are used in common when compared to the light sensing device 1000 of FIG. 6. The rest of the components and the functions of the light sensing device 1000*a* are the same as or similar to those of the light sensing device 1000, and thus descriptions thereof will be omitted herein.

For convenience of explanation, the illumination sensing device 1000*a* of FIG. 7 will be described with reference to the illumination sensing device 1000 of FIG. 6. The photoelectric conversion unit 210*a* of FIG. 7 corresponds to the current generator 110 of FIG. 6. The photoelectric conversion unit 210*a* may be covered with a light shielding film (not shown) to function as a current generator. In addition, the second operational amplifying unit 220*a* of FIG. 7 may correspond to the first operational amplifying unit 120 of FIG. 6. The second operational amplifying unit 220*a* of FIG. 7 may exclude the operation of capacitor C2 and further include a plurality of switches (SW1-0, SW1-1, and SW1-2) to function as a first operational amplifying unit.

As described with reference to FIG. 3, the reference voltage setting mode and the illumination measuring mode may be performed independently. In order to independently perform the two modes, a switch SW2-2 is off in the reference voltage setting mode, and a switch SW2-2 is on in the illumination measuring mode to apply the set reference voltage.

The operation of the circuit of the illumination sensing device 1000*a* shown in FIG. 7 is the same as that of the illumination sensing device 1000 of FIG. 6, and thus description thereof will be omitted herein.

Figure 8:
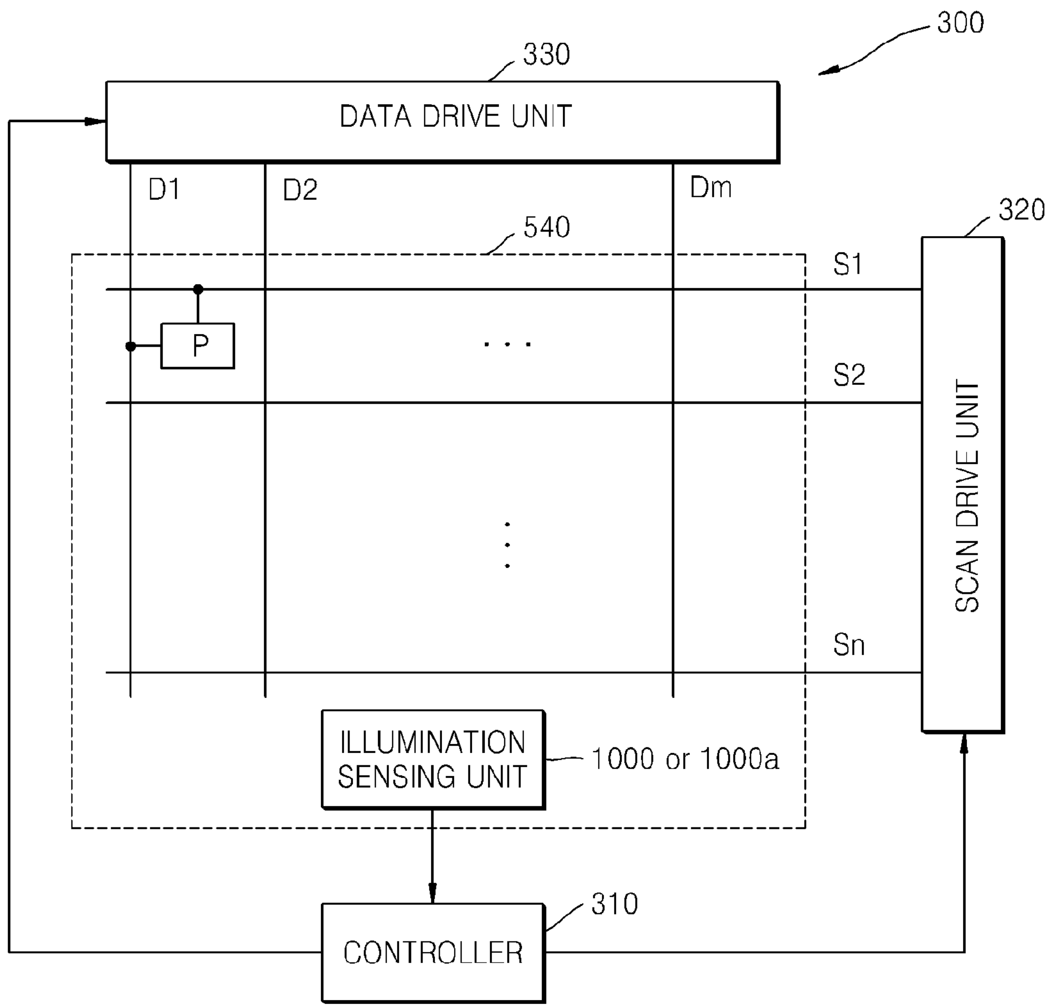
FIG. 8 is a schematic diagram of a display device including the illumination sensing device according to an embodiment of the present invention.

FIG. 8 is a schematic diagram of a display device 300 including the illumination sensing device 1000 or 1000*a* of FIG. 2 or 3, according to an embodiment of the present invention. Referring to FIG. 8, the display device 300 includes a pixel array 540 including a plurality of pixels P, the illumination sensing device 1000 or 1000*a*, drive units 320 and 330, and a controller 310.

The controller 310 controls the drive units 320 and 330 to display data. In addition, the controller 310 controls brightness of data displayed in the plurality of pixels P according to ambient illumination sensed by the illumination sensing device 1000.

The drive units 320 and 330 receive a control signal and data signal from the controller 310 and apply signals to a plurality scan lines S1, S2, . . . Sn and a plurality data lines D1, D2, . . . Dm. Data is displayed in the pixels P by applying the signals to the pixels. FIG. 8 shows the scan drive unit 320 and the data drive unit 330, but an embodiment of the present invention is not limited thereto. That is, even though the display device 300 shown in FIG. 8 is an OLED display device, a PDP or LCD may also be used as the display device 300.

The plurality of pixels P are disposed at a region where the plurality scan lines S1, S2, . . . Sn and the plurality data lines D1, D2, . . . Dm cross each other. Each of the pixels P displays data according to a scan signal, a data signal, or the like. The displayed data may have a brightness controlled by the controller 310. A group of the plurality of pixels P may be referred to as a pixel unit.

The illumination sensing device 1000 or 1000*a* may be embedded in one surface of a panel including the plurality of pixels P. However, the position and shape of the illumination sensing device 1000 or 1000*a* are not limited as long as the illumination sensing device 1000 or 1000*a* is embedded in the display device 300.

As described above, a display device including an illumination sensing device accurately senses ambient brightness so that auto brightness control may be accurately performed.

According to an embodiment of the present invention, the dark current may be accurately compensated although the dark current flowing in the photodiode is not completely the same as the dark current flowing in the dark diode, and thus ambient brightness may be measured when illumination is measured without being influenced by ambient temperature.

In addition, a reference voltage having a compensated error of an operational amplifier may be obtained, and thus illumination may be accurately measured.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An illumination sensing device comprising:
an illumination sensing unit comprising:
a first dark diode configured to generate a first dark current;
a first photodiode electrically connected to the first dark diode in series and configured to generate a photocurrent and a second dark current;
a first operational amplifying unit connected to the first dark diode and the first photodiode; and
an illumination calculator connected to an output terminal of the first operational amplifying unit; and
a reference voltage setting unit configured to determine a reference voltage for the illumination sensing unit and to provide the reference voltage to a non-inverting input terminal of the first operational amplifying unit, the reference voltage setting unit comprising:
a second dark diode configured to generate the first dark current;
a second photodiode electrically connected to the second dark diode in series and comprising a light shielding film for generating the second dark current;
a second operational amplifying unit connected to the second dark diode and the second photodiode; and
a voltage setting unit connected to an output terminal of the second operational amplifying unit and configured to determine the reference voltage,
wherein the reference voltage is determined to compensate for an offset voltage of the first operational amplifying unit and a difference between the first dark current and the second dark current.

2. The illumination sensing device of claim 1, wherein
an inverting input terminal of the first operational amplifying unit is connected to a cathode terminal of the first photodiode.

3. The illumination sensing device of claim 2, wherein the first operational amplifying unit comprises a first switch connecting the inverting input terminal and the output terminal of the first operational amplifying unit.

4. The illumination sensing device of claim 2, further comprising a capacitor connected between the inverting input terminal and the output terminal of the first operational amplifying unit.

5. The illumination sensing device of claim 1, wherein
the second dark diode is connected between a first power supply and a reference node between the second dark diode and the second photodiode and generates the first dark current according to ambient temperature; and
the second photodiode is connected between the reference node and a second power supply and generates the second dark current according to the ambient temperature.

6. The illumination sensing device of claim 5, wherein the second operational amplifying unit comprises:
a first input terminal; and
a second input terminal connected to the reference node through a second switch or receiving a control voltage through a third switch.

7. The illumination sensing device of claim 6, wherein the second operational amplifying unit further comprises a fourth switch connecting the first input terminal and the output terminal of the second operational amplifying unit.

8. The illumination sensing device of claim 6, wherein the voltage setting unit compares a voltage of the reference node output through the second operational amplifying unit with the control voltage output by the second operational amplifying unit and determines a voltage equalizing the two voltages as the reference voltage of the first operational amplifying unit.

9. A display device comprising:
- a pixel unit comprising a plurality of pixels;
- an illumination sensing device sensing illumination of external incident light;
- a plurality of drive units operating the pixel unit; and
- a controller to control the drive units and brightness of data displayed in the pixel unit according to the illumination of light sensed by the illumination sensing device,
- wherein the illumination sensing device comprises:
  - an illumination sensing unit comprising:
    - a first dark diode configured to generate a first dark current;
    - a first photodiode electrically connected to the first dark diode in series and configured to generate a photocurrent and a second dark current;
    - a first operational amplifying unit connected to the first dark diode and the first photodiode; and
    - an illumination calculator connected to an output terminal of the first operational amplifying unit; and
  - a reference voltage setting unit configured to determine a reference voltage for the illumination sensing unit and to provide the reference voltage to a non-inverting input terminal of the first operational amplifying unit, the reference voltage setting unit comprising:
    - a second dark diode configured to generate the first dark current;
    - a second photodiode electrically connected to the second dark diode in series and comprising a light shielding film for generating the second dark current;
    - a second operational amplifying unit connected to the second dark diode and the second photodiode; and
    - a voltage setting unit connected to an output terminal of the second operational amplifying unit and configured to determine the reference voltage,
    - wherein the reference voltage is determined to compensate for an offset voltage of the first operational amplifying unit and a difference between the first dark current and the second dark current.

10. The display device of claim 9, wherein the display device is one of an organic light emitting diode (OLED) display, a plasma display panel (PDP) or a liquid crystal display (LCD) panel.

11. The display device of claim 9, wherein the illumination calculator calculates ambient illumination using a voltage output by the first operational amplifying unit.

12. The illumination sensing device of claim 1, wherein the illumination sensing device is embedded on a surface of a panel including a plurality of pixels.

13. The illumination sensing device of claim 1, wherein the illumination calculator calculates ambient illumination using a voltage output by the first operational amplifying unit.

* * * * *